(12) United States Patent
Kamata et al.

(10) Patent No.: US 9,142,981 B2
(45) Date of Patent: Sep. 22, 2015

(54) CELL BALANCE CONTROL UNIT

(71) Applicant: KEIHIN CORPORATION, Tokyo (JP)

(72) Inventors: Seiji Kamata, Utsonomiya (JP); Eishin Matsumoto, Tochigi-ken (JP)

(73) Assignee: KEIHIN CORPORATION (JP)

( * ) Notice: Subject to any disclaimer, the term of this patent is extended or adjusted under 35 U.S.C. 154(b) by 350 days.

(21) Appl. No.: 13/633,215

(22) Filed: Oct. 2, 2012

(65) Prior Publication Data

US 2013/0088202 A1    Apr. 11, 2013

(30) Foreign Application Priority Data

Oct. 7, 2011    (JP) .................................. 2011-222860

(51) Int. Cl.
| | | |
|---|---|---|
| *H02J 7/00* | (2006.01) | |
| *B60L 11/18* | (2006.01) | |
| *G01R 31/36* | (2006.01) | |

(52) U.S. Cl.
CPC ........... *H02J 7/0016* (2013.01); *B60L 11/1866* (2013.01); *G01R 31/3658* (2013.01); *Y02T 10/7005* (2013.01); *Y02T 10/7011* (2013.01); *Y02T 10/7055* (2013.01); *Y02T 10/7061* (2013.01)

(58) Field of Classification Search
CPC .................... H01M 2010/4271; H01M 10/486; H01M 10/44; G01R 31/3658; B60L 11/1866; B60L 11/1851
USPC .......................................... 320/119, 126, 134
See application file for complete search history.

(56) References Cited

U.S. PATENT DOCUMENTS

| | | | | |
|---|---|---|---|---|
| 5,998,967 | A  * | 12/1999 | Umeki et al. ................. | 320/122 |
| 8,148,942 | B2 * | 4/2012  | Densham et al. ............. | 320/116 |
| 2006/0022646 | A1 * | 2/2006 | Moore et al. .................. | 320/150 |
| 2007/0279003 | A1 * | 12/2007 | Altemose et al. ............ | 320/118 |
| 2008/0218130 | A1 * | 9/2008 | Guo et al. ..................... | 320/162 |
| 2010/0253287 | A1 * | 10/2010 | Kim et al. ..................... | 320/118 |
| 2012/0133330 | A1 * | 5/2012 | Kamata et al. ................ | 320/118 |
| 2012/0212182 | A1 * | 8/2012 | Li .................................. | 320/116 |
| 2013/0049673 | A1 * | 2/2013 | Agarwal et al. ............... | 320/101 |
| 2013/0113280 | A1 * | 5/2013 | Yang et al. ...................... | 307/19 |

FOREIGN PATENT DOCUMENTS

| | | |
|---|---|---|
| CN | 102195324 A | 9/2011 |
| JP | 2009-288034 A | 12/2009 |

OTHER PUBLICATIONS

Chinese Office Action corresponding to Application No. 201210374500.2; Date of Mailing: Jun. 3, 2015, with English translation.

* cited by examiner

*Primary Examiner* — Sun Lin
(74) *Attorney, Agent, or Firm* — Cantor Colburn LLP

(57) ABSTRACT

A cell balance control unit is provided, including: a discharge circuit connected to each of a plurality of battery cells constituting a battery in parallel; a voltage detecting circuit that detects a voltage of each of the battery cells; and a control device that controls each of the switching elements of the discharge circuit so that the voltage of each of the battery cells is made uniform based on voltage detection results of each of the battery cells, wherein the control device controls the switching elements of the discharge circuits connected to the adjacent battery cells in each different duty ratio, and detects disconnection of wirings extracted from both ends of each battery cell based on a potential difference between the adjacent battery cells.

3 Claims, 4 Drawing Sheets

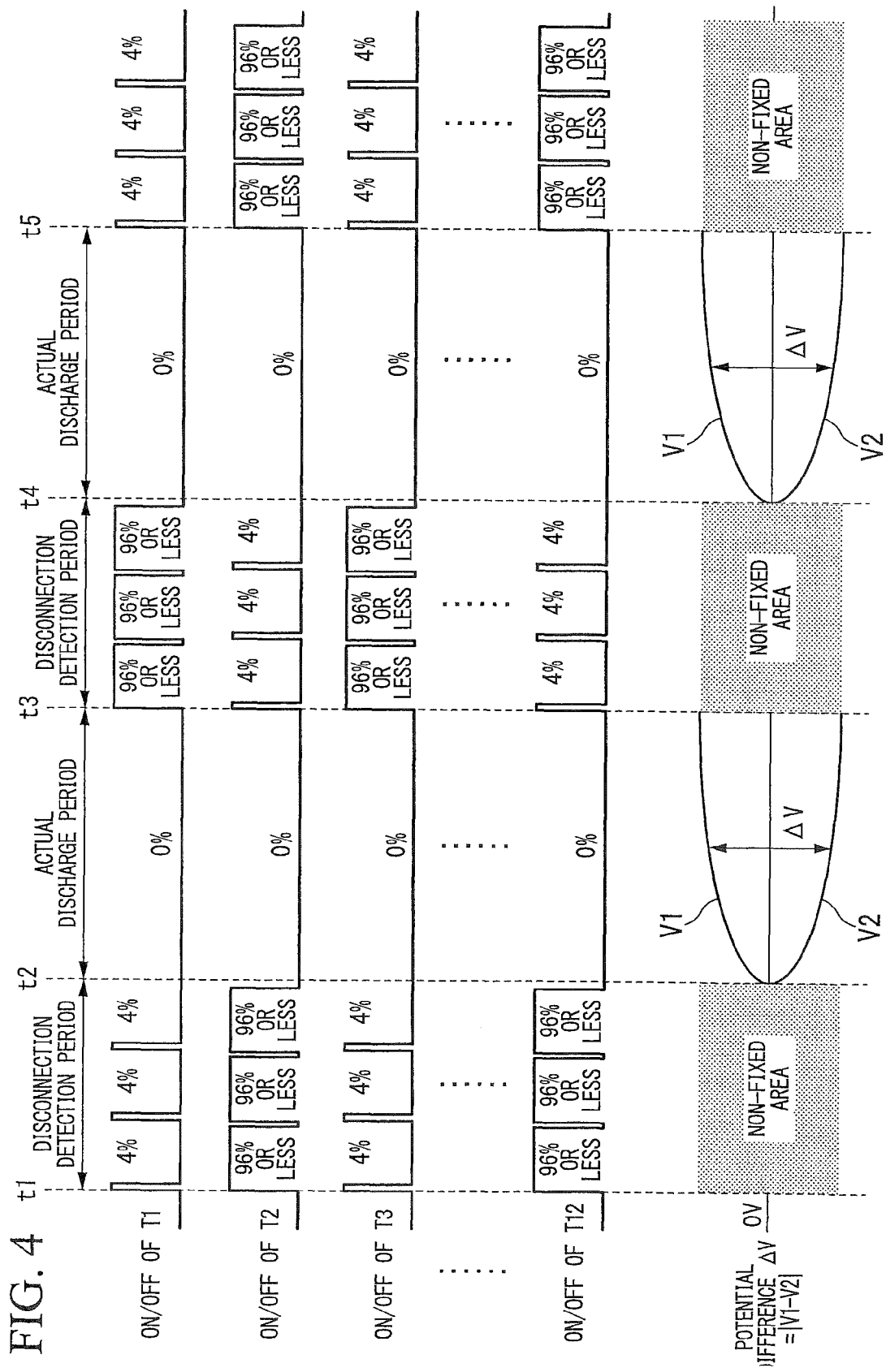

CELL BALANCE CONTROL UNIT

BACKGROUND OF THE INVENTION

The present invention relates to a cell balance control unit.
Priority is claimed on Japanese Patent Application No. 2011-222860, filed on Oct. 7, 2011, the content of which is incorporated herein by reference.

FIELD OF THE INVENTION

As is well known, a motor used as a source of power, and a high voltage and a high capacity battery that supplies power to the motor are mounted to vehicles such as an electric automobile and a hybrid automobile. The battery is configured such that a plurality of battery cells formed of a lithium-ion battery, a nickel-hydrogen battery or the like are connected to each other in series. In the related art, a cell balance control for making each cell voltage uniform by discharging the battery cells in an overcharged state is performed in order to maintain the performance of a battery.

A flying capacitor-type voltage detecting circuit is connected to each battery cell in parallel, and voltage monitoring of each battery cell is realized by fetching an output voltage (that is, voltage between terminals of a flying capacitor) of the voltage detecting circuit in a micro-computer. In addition, a discharge circuit composed of a series circuit of a switching element and a bypass resistor is connected to each battery cell in parallel, and the uniformity of each cell voltage is realized by turning on (discharging the battery cell) the switching element of the discharge circuit connected to the battery cell in an overcharged state.

Here, when disconnection has occurred in wiring extracted from both ends of each battery cell, an exact cell voltage cannot be fetched in a micro-computer from the flying capacitor, and thus there is a problem in that it is difficult to perform appropriate cell balance control. In order to solve this problem, for example, Japanese Unexamined Patent Application, First Publication No. 2009-288034 discloses a technique for detecting the presence or absence of the disconnection of the wiring extracted from both ends of each battery cell by using the above-mentioned discharge circuit.

DESCRIPTION OF RELATED ART

In the above-mentioned technique of Japanese Unexamined Patent Application, First Publication No. 2009-288034, in order to detect the presence or absence of the disconnection, since it is necessary to alternately turn off odd-numbered and even-numbered switching elements so that the switching elements of the discharge circuits connected to the adjacent battery cells are not simultaneously turned off, the discharge period required for an original cell balance control cannot be sufficiently secured, and thus there is a problem in that it is difficult to perform appropriate cell balance control.

The present invention is contrived in view of such circumstances, and an object thereof is to provide a cell balance control unit which is capable of realizing appropriate cell balance control by securing an originally required discharge period.

SUMMARY OF THE INVENTION

The present invention employs the following configuration to solve the above problems.

(1) According to an aspect of the present invention, a cell balance control unit is provided, including: a discharge circuit, composed of a series circuit of a bypass resistor and a switching element, which is connected to each of a plurality of battery cells constituting a battery in parallel; a voltage detecting circuit that detects a voltage of each of the battery cells; and a control device that controls each of the switching elements so that the voltage of each of the battery cells is made uniform based on voltage detection results of each of the battery cells obtained from the voltage detecting circuit, wherein the control device controls the switching elements of the discharge circuits connected to the adjacent battery cells in each different duty ratio, and detects disconnection of wirings extracted from both ends of each battery cell based on a potential difference between the adjacent battery cells.

(2) In the cell balance control unit described in (1) above, the control device may control one of the switching elements of the discharge circuits connected to the adjacent battery cells in a first duty ratio, and may control other of the switching elements of the discharge circuits in a second duty ratio.

(3) In the cell balance control unit described in (2) above, the control device may alternately switch values of the first duty ratio and the second duty ratio.

BRIEF DESCRIPTION OF THE DRAWINGS

FIG. 4 is a timing diagram illustrating operations after the duty ratio in an actual discharge period is set to 0%.

DETAILED DESCRIPTION OF THE INVENTION

Hereinafter, an embodiment of the present invention will be described in detail with reference to the accompanying drawings.

Figure 1:
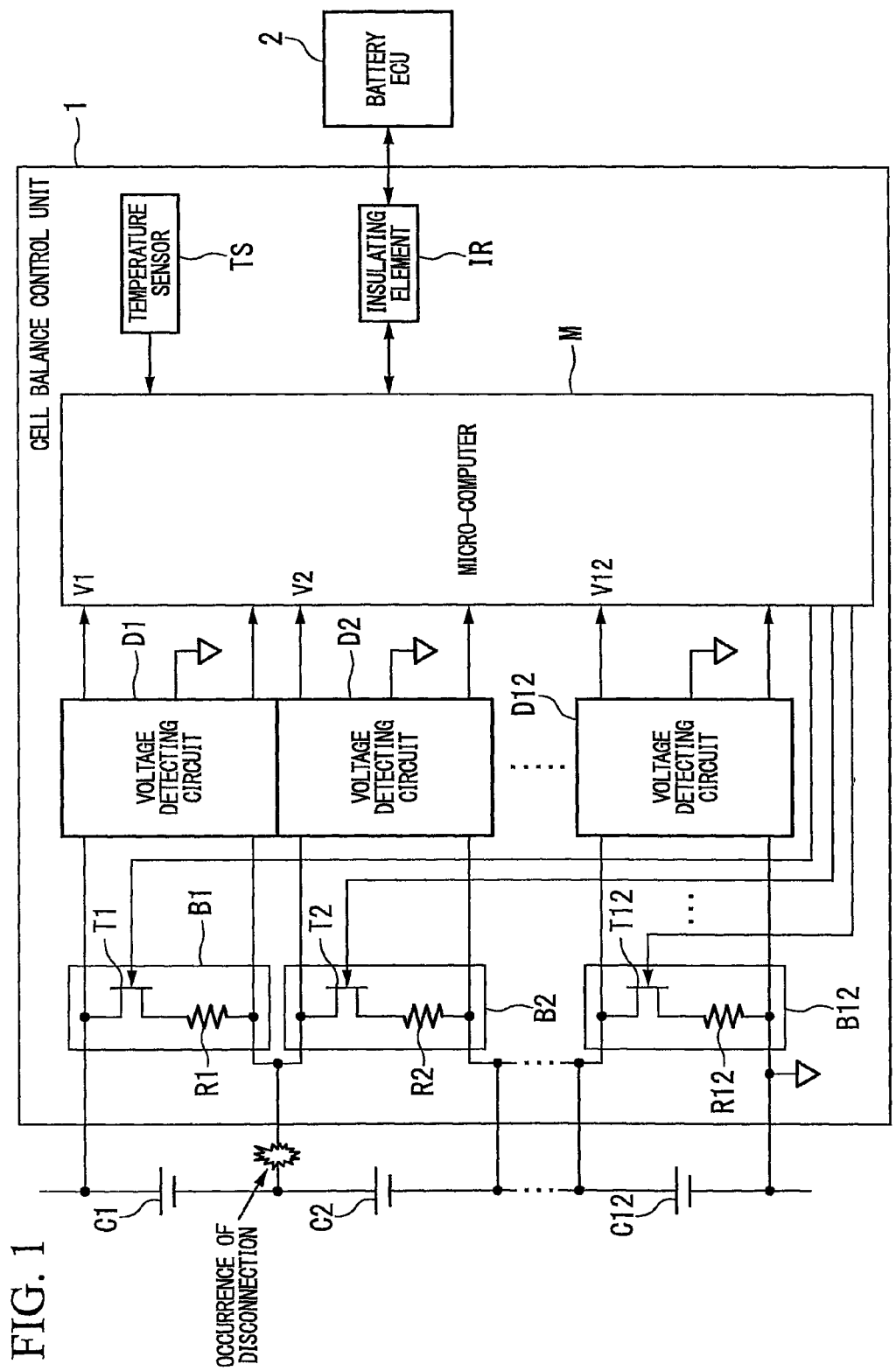
FIG. 1 is a schematic configuration diagram illustrating a cell balance control unit 1 according to the present embodiment.

FIG. 1 is a schematic configuration diagram illustrating a cell balance control unit 1 according to the present embodiment. As shown in FIG. 1, the cell balance control unit 1 is used in performing a cell balance control for uniformizing voltages of twelve battery cells C1 to C12, connected to each other in series, which constitutes a battery, and includes twelve discharge circuits B1 to B12, twelve voltage detecting circuits D1 to D12, a temperature sensor TS, a micro-computer M, and an insulating element IR.

Each of the discharge circuits B1 to B12 is composed of a series circuit such as a bypass resistor and a switching element such as a transistor, and is connected to each of the battery cells C1 to C12 in parallel. Meanwhile, in FIG. 1, the sign of the bypass resistor provided to each of the discharge circuits B1 to B12 is set to R1 to R12, and the sign of the switching element is set to T1 to T12.

The voltage detecting circuits D1 to D12 are connected to each of the battery cells C1 to C12 in parallel, detect voltages of the battery cells which are respectively connected to the circuits, and output voltage detection results thereof to the micro-computer M. Meanwhile, the voltage detecting circuits D1 to D12 include a capacitor (flying capacitor) connected to each of the battery cells C1 to C12 in parallel. That is, the voltage between terminals of each flying capacitor is output to an A/D input port of the micro-computer M as the voltage detection result of each of the battery cells C1 to C12.

The temperature sensor TS is a thermister mounted onto a circuit substrate (not shown) together with the discharge circuits B1 to B12, the voltage detecting circuits D1 to D12, the insulating element IR and the micro-computer M, detects the temperature of the circuit substrate, and outputs a signal indicating the detected value to the micro-computer M. Meanwhile, although the mounting position of the temperature sensor TS onto the circuit substrate is not particularly limited, it is preferable to mount the temperature sensor in the vicinity of the voltage detecting circuits D1 to D12 or the micro-computer M having the possibility of a breakdown or malfunction of the circuit element occurring due to a rise in the substrate temperature.

The micro-computer M (control device) is an IC chip in which a CPU (Central Processing Unit), a memory, an input and output interface and the like are integrally incorporated, and is communicably connected to a battery ECU (Electronic Control Unit) 2 which is a higher-order control unit through the insulating element IR such as a photo-coupler. The micro-computer M has a function of acquiring the voltage detection result of each of the battery cells C1 to C12 as digital data by performing an A/D conversion on the input voltage of the A/D input port, that is, the output voltage (voltage between terminals of the flying capacitor) of each of the voltage detecting circuits D1 to D12, and storing the data in an internal memory or transmitting it to the battery ECU 2.

In addition, although a detailed description will be made later, the micro-computer M has a function of controlling the switching elements T1 to T12 of each of the discharge circuits B1 to B12 so that the voltage of each of the battery cells C1 to C12 is made uniform, based on the value (substrate temperature) detected from the temperature sensor TS and the voltage detection result of each of the battery cells C1 to C12, that is, a cell balance control function.

Further, the micro-computer M has also a function of controlling the switching elements of the discharge circuits connected to the adjacent battery cells in each different duty ratio, and detecting the disconnection of the wiring extracted from both ends of each battery cell based on the potential difference between the adjacent battery cells.

Next, operations of the cell balance control unit 1 having the above-mentioned configuration will be described in detail with reference to FIGS. 2 to 4. Meanwhile, in the following, as shown in FIG. 1, a description will be made on the assumption of a case where the disconnection is generated in the wiring extracted from the connection point between the battery cells C1 and C2.

Figure 2:
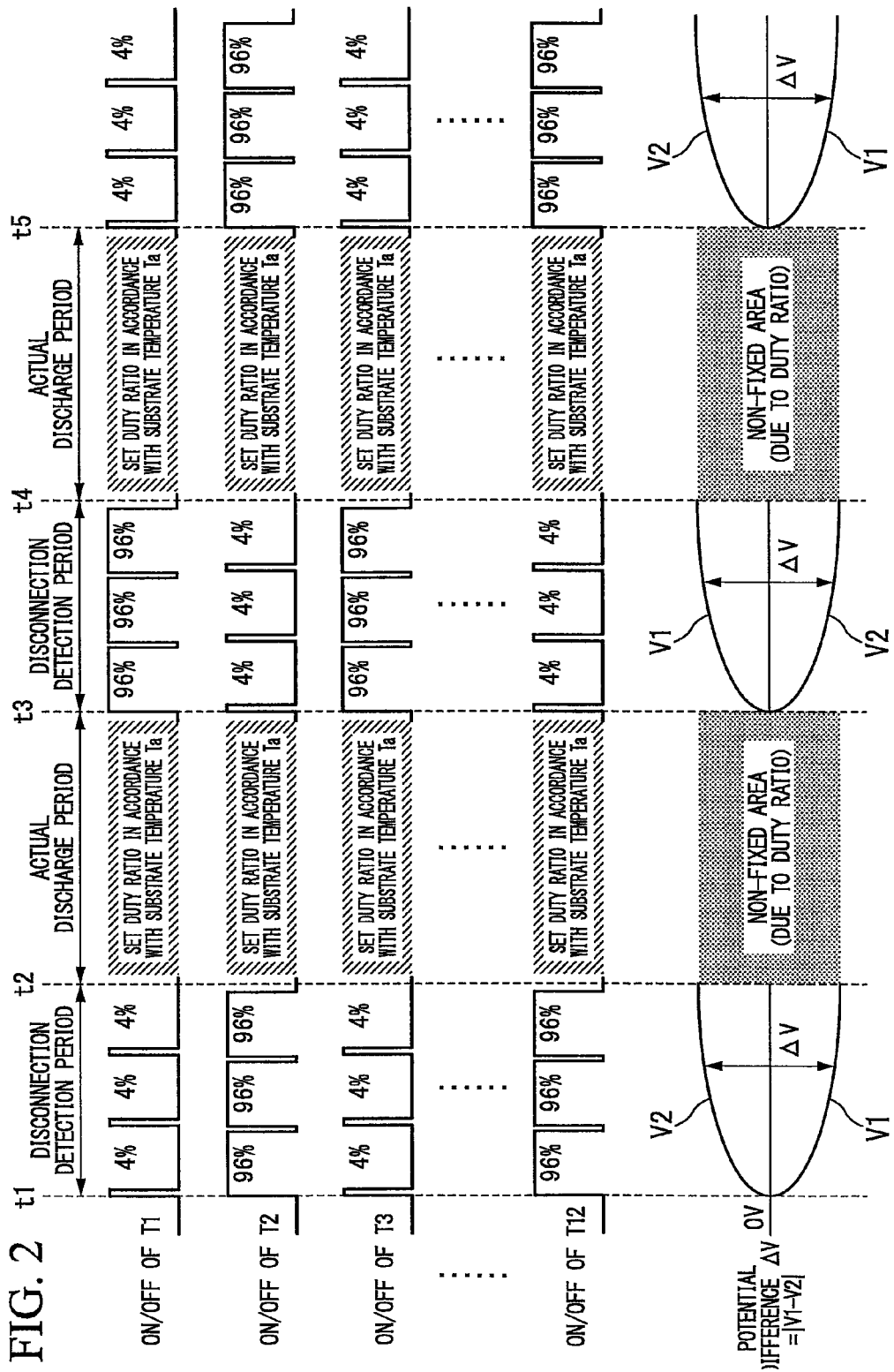
FIG. 2 is a timing diagram illustrating operations of the cell balance control unit 1.

As shown in the timing diagram of FIG. 2, the micro-computer M controls the switching elements of the discharge circuits connected to the adjacent battery cells in each different duty ratio, in the disconnection detection period (for example, 150 ms) of the time t1-t2. Specifically, the micro-computer M, for example, controls the switching elements T1, T3, 15, T7, T9 and T11 of the discharge circuits B1, B3, B5, B7, B9 and B11 connected to the odd-numbered battery cells C1, C3, C5, C7, C9 and C11 in the duty ratio (first duty ratio) of 4%, and controls the switching elements T2, T4, T6, T8, T10 and T12 of the discharge circuits B2, B4, B6, B8, B10 and B12 connected to the even-numbered battery cells C2, C4, C6, C8, C10 and C12 in the duty ratio (second duty ratio) of 96%.

Here, as mentioned above, when the disconnection has occurred in the wiring extracted from the connection point between the battery cells C1 and C2, a phenomenon is generated in which the potential difference ΔV (=|V1−V2|) between an output voltage V1 of the voltage detecting circuit D1 and an output voltage V2 of the voltage detecting circuit D2 gradually increases after the start time t1 of the disconnection detection period (see FIG. 2). When such a phenomenon is used, it is possible to detect in which wiring the disconnection has occurred based on the potential difference ΔV between the adjacent battery cells.

Specifically, after the lapse of a certain period of time from the start time t1 of the disconnection detection period, the micro-computer M fetches the output voltages V1 to V12 of each of the voltage detecting circuits D1 to D12 and converts the output voltages into digital data. Thereafter, the micro-computer M sequentially calculates the potential difference ΔV between the adjacent battery cells, and searches for values equal to or greater than the threshold ΔVth among them. As mentioned above, when the disconnection has occurred in the wiring extracted from the connection point between the battery cells C1 and C2, the potential difference ΔV between V1 which is the voltage detection result of the battery cell C1 and V2 which is the voltage detection result of the battery cell C2 becomes equal to or greater than the threshold ΔVth. Therefore, in this case, the micro-computer M determines that the disconnection has occurred in the wiring extracted from the connection point between the battery cells C1 and C2.

Meanwhile, when the potential difference ΔV equal to or greater than the threshold ΔVth is not present, the micro-computer M determines that each wiring is normal.

When the above-mentioned disconnection detection process is terminated in the disconnection detection period of the time t1-t2, the micro-computer M controls the switching elements T1 to T12 of each of the discharge circuits B1 to B12 so that the voltage of each of the battery cells C1 to C12 is made uniform, based on the substrate temperature Ta obtained from the temperature sensor TS and the voltage detection results V1 and V12 of each of the battery cells C1 to C12, in the actual discharge period (for example, 500 ms) of the subsequent time t2-t3.

Specifically, the micro-computer M calculates a predetermined discharge power value W1 based on the following Expression (1) composed of the substrate temperature Ta (° C.), the maximum allowable temperature Tmax (° C.) of the circuit substrate and the thermal resistance Rth (° C./W) of the circuit substrate. Meanwhile, in the following Expression (1), the maximum allowable temperature Tmax and the thermal resistance Rth are fixed values set in the micro-computer M in advance.

$$W1 = (Tmax - Ta)/Rth \quad (1)$$

The micro-computer M calculates an overcharged-cell discharge power value W2 based on the following Expression (2) composed of the resistance value r of the bypass resistors R1 to R12 provided to each of the discharge circuits B1 to B12 and the voltage detection result Vi (i is the identification number of the battery cell in an overcharged state) of the battery cell in an overcharged state.

$$W2 = \Sigma(Vi^2/r) \quad (2)$$

For example, when the battery cells C1, C5, and C10 are battery cells in an overcharged state, the micro-computer M calculates the overcharged-cell discharge power value W2 by substituting voltage detection results V1, V5, and V10 of the battery cells C1, C5, and C10 into the above Expression (2) and calculating a value of $(V1^2/r)+(V5^2/r)+(V10^2/r)$.

The predetermined discharge power value W1 is a power value required for raising the substrate temperature Ta up to the maximum allowable temperature Tmax, and the overcharged-cell discharge power value W2 is the sum total of values of the discharge power consumed in the discharge circuit when the switching element of the discharge circuit connected to the battery cell in an overcharged state is controlled in the duty ratio of 100%. Here, on the assumption that the overcharged-cell discharge power value W2 is equal to or less than the predetermined discharge power value W1, the substrate temperature Ta does not exceed the maximum allowable temperature Tmax (circuit components are not broken down) even though the switching element of the discharge circuit connected to the battery cell in an overcharged state is controlled in the duty ratio of 100%.

On the other hand, when the overcharged-cell discharge power value W2 is lowered up to the predetermined discharge power value W1 in the case where the overcharged-cell discharge power value W2 exceeds the predetermined discharge power value W1, the substrate temperature Ta does not exceed the maximum allowable temperature Tmax. In other words, when the current flowing in the discharge circuit is reduced by setting the duty ratio to be lower than 100% by the proportion at which the overcharged-cell discharge power value W2 exceeds the predetermined discharge power value W1, the substrate temperature Ta does not exceed the maximum allowable temperature Tmax. Therefore, the duty ratio required for performing the cell balance control so that the substrate temperature Ta does not exceed the maximum allowable temperature Tmax is expressed in the ratio (W1/W2) of the predetermined discharge power value W1 to the overcharged-cell discharge power value W2.

That is, the micro-computer M calculates a duty ratio Dy based on the following Expression (3) composed of the predetermined discharge power value W1 and the overcharged-cell discharge power value W2, and controls the switching element of the discharge circuit connected to the battery cell in an overcharged state using the calculated duty ratio Dy. Meanwhile, as can be seen from the following Expression (3), when the overcharged-cell discharge power value W2 is smaller than the predetermined discharge power value W1, the duty ratio Dy exceeds 100%. However, in such a case, the duty ratio Dy may be set to 100% at all times. In addition, the micro-computer M sets the duty ratio Dy to 0% with respect to the switching element of the discharge circuit connected to the battery cell which does not fall under the overcharged state.

$$Dy=(W1/W2) \times 100 \quad (3)$$

Through the cell balance control performed by the above-mentioned micro-computer M, the cell balance (uniformity of the cell voltage) of each of the cells C1 to C12 is secured by the discharge of the battery cell in an overcharged state, and the substrate temperature Ta is suppressed to the maximum allowable temperature Tmax or lower, so that it is possible to prevent the circuit components from being broken down due to a rise in temperature.

When the above-mentioned cell balance control is terminated in the actual discharge period of the time t2-t3, the micro-computer M controls the switching elements of the discharge circuits connected to the adjacent battery cells in each different duty ratio, in the disconnection detection period of the subsequent time t3-t4; and detects the presence or absence of the disconnection of each wiring based on the potential difference between the adjacent battery cells.

Here, the different point from the previous disconnection detection period is that the micro-computer M controls the switching elements T1, T3, T5, T7, T9 and T11 of the discharge circuits B1, B3, B5, B7, B9 and B11 connected to the odd-numbered battery cells C1, C3, C5, C7, C9 and C11 in the duty ratio (first duty ratio) of 96%, and controls the switching elements T2, T4, T6, T8, T10 and T12 of the discharge circuits B2, B4, B6, B8, B10 and B12 connected to the even-numbered battery cells C2, C4, C6, C8, C10 and C12 in the duty ratio (second duty ratio) of 4%.

In this manner, whenever the disconnection detection period comes, the values of the first duty ratio and the second duty ratio are alternately switched, and thus it is possible to prevent one of the adjacent battery cells from being over-discharged. Meanwhile, as shown in FIG. 2, even when the values of the first duty ratio and the second duty ratio are switched, the behavior of the voltage detection result V1 of the battery cell C1 and the voltage detection result V2 of the battery cell C2 is merely reversed, and thus it is possible to detect the presence or absence of the disconnection without any problems by the comparison of the potential difference ΔV between both voltages with the threshold ΔVth.

When the disconnection detection process is terminated by switching the values of the first duty ratio and the second duty ratio in the disconnection detection period of the time t3-t4, the micro-computer M performs the cell balance control based on the substrate temperature Ta obtained from the temperature sensor TS and the voltage detection results V1 to V12 of each of the battery cells C1 to C12, similarly to the previous actual discharge period, in the actual discharge period of the subsequent time t4-t5. In this manner, the micro-computer M performs the detection of the presence or absence of the disconnection and the voltage uniformity of each of the battery cells C1 to C12 in real time while alternately repeating the disconnection detection process and the cell balance control which are mentioned above.

Figure 3:
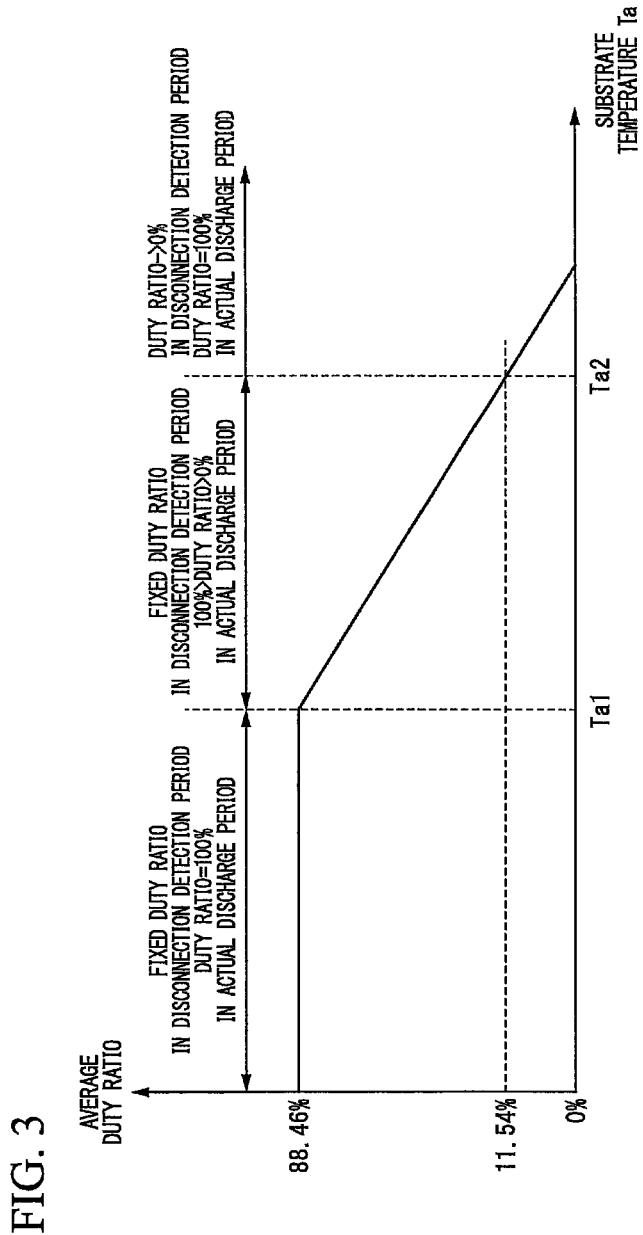
FIG. 3 is a diagram illustrating a relationship between an average duty ratio and a substrate temperature Ta.

FIG. 3 shows a relationship between the average duty ratio and the substrate temperature Ta within the period (1,300 ms) of the time t1-t5. As shown in FIG. 3, since the overcharged-cell discharge power value W2 does not exceed the predetermined discharge power value W1 until the substrate temperature Ta reaches a certain temperature Ta1, and the duty ratio in the actual discharge period is set to 100% (the duty ratio in the disconnection detection period is fixed to 4% and 96%), the average duty ratio becomes 88.46%.

When the substrate temperature Ta becomes higher than Ta1, and the overcharged-cell discharge power value W2 starts to exceed the predetermined discharge power value W1, the duty ratio in the actual discharge period is set to be smaller than 100% (the duty ratio in the disconnection detection period is fixed to 4% and 96%), and thus the average duty ratio becomes smaller than 88.46%. Here, on the assumption that the duty ratio in the actual discharge period reaches 0% (the average duty ratio is 11.54%) when the substrate temperature Ta reaches Ta2, the duty ratio in the actual discharge period cannot be lowered even though the substrate temperature Ta rises higher than that.

Consequently, after the duty ratio in the actual discharge period is set to 0%, the micro-computer M brings the average duty ratio close to 0% by lowering the duty ratio (particularly, 96%) in the disconnection detection period in accordance with a rise in the substrate temperature Ta. In this case, as mentioned above, even when the disconnection has occurred in the wiring extracted from the connection point between the battery cells C1 and C2, the potential difference ΔV between the voltage detection result V1 of the battery cell C1 and the voltage detection result V2 of the battery cell C2 is reduced in the disconnection detection period, and thus it is likely not to exceed the threshold ΔVth.

Consequently, after the duty ratio in the actual discharge period is set to 0% as shown in FIG. 4, the micro-computer M lowers the duty ratio in the disconnection detection period in accordance with a rise in the substrate temperature Ta, and detects the presence or absence of the disconnection based on the voltage detection results V1 to V12 of each of the battery cells C1 to C12 obtained during the actual discharge period. In this case, since the potential difference ΔV between the voltage detection result V1 of the battery cell C1 and the voltage detection result V2 of the battery cell C2 in the actual discharge period increases to the extent of exceeding the threshold $\Delta$Vth, it is possible to reliably detect the presence or absence of the disconnection.

As described above, according to the present embodiment, since the switching elements of the discharge circuits connected to the adjacent battery cells are controlled in each different duty ratio, and the disconnection of the wiring extracted from both ends of each battery cell is detected on the basis of the potential difference between the adjacent battery cells, it is possible to realize appropriate cell balance control by securing an originally required discharge period.

In addition, according to the present embodiment, since the substrate temperature Ta can be suppressed to the maximum allowable temperature Tmax or lower while performing the cell balance control, it is possible to maintain appropriate cell balance control by preventing the breakdown or malfunction of the circuit element caused by a rise in the substrate temperature Ta.

Meanwhile, the present invention is not limited to the above-mentioned embodiment, and includes the following modified example.

That is, in the above-mentioned embodiment, although the cell balance control unit 1 that performs the cell balance control on twelve cells C1 to C12 is illustrated by way of example, the number of cells to be controlled is not limited to 12. In addition, for example, when the battery is formed by the series connection of 45 cells, it is possible to perform the cell balance control on all the cells constituting the battery by using four cell balance control units 1.

In addition, in the above-mentioned embodiment, the substrate temperature Ta detected by the temperature sensor TS is used in calculating the predetermined discharge power value W1 as it is. However, when a temperature correction is required, the predetermined discharge power value W1 may be calculated using the substrate temperature Ta after the correction. In addition, in the above-mentioned embodiment, the duty control of the switching element is performed by using the duty ratio Dy obtained by the above Expression (3) as it is. However, it is preferable to multiply the duty ratio Dy by a correction coefficient for correcting the non-linearity of the predetermined discharge power value W1 and the overcharged-cell discharge power value W2.

In addition, in the above-mentioned embodiment, although a case where the proportion of the first duty ratio to the second duty ratio in the disconnection detection period is fixed is illustrated by way of example, the proportion of the first duty ratio to the second duty ratio may be made variable. In this case, it is necessary to adjust the threshold $\Delta$Vth in accordance with the proportion of the first duty ratio to the second duty ratio. In addition, the duty ratio in the actual discharge period may be adjusted in accordance with the excess and deficiency of the discharge amount.

What is claimed is:

1. A cell balance control unit comprising:
    a discharge circuit including, a series circuit of a bypass resistor and a switching element, which is connected to each of a plurality of battery cells constituting a battery in parallel;
    a voltage detecting circuit that detects a voltage of each of the battery cells; and
    a control device that performs a disconnection detection process in a disconnection detection period and performs a cell balance control in an actual discharge period,
    wherein as the disconnection detection process in the disconnection detection period, the control device controls all of the switching elements of the discharge circuits connected to the odd-numbered battery cells in a duty ratio and controls all of the switching elements of the discharge circuits connected to the even-numbered battery cells in an other duty ratio, and detects disconnection of wirings extracted from both ends of each battery cell based on a potential difference between the adjacent battery cells, and
    as the cell balance control in the actual discharge period, the control device controls each of the switching elements so that the voltage of each of the battery cells is made uniform based on voltage detection results of each of the battery cells obtained from the voltage detecting circuit.

2. The cell balance control unit according to claim 1, wherein the control device controls all of the switching elements of the discharge circuits connected to the odd-numbered battery cells in a first duty ratio and controls all of the switching elements of the discharge circuits connected to the even-numbered battery cells in a second duty ratio.

3. The cell balance control unit according to claim 2, wherein the control device alternately repeats the disconnection detection process in the disconnection detection period and the cell balance control in the actual discharge period, and
    whenever the disconnection detection period comes, the control device alternately switches values of the first duty ratio and the second duty ratio.

\* \* \* \* \*